United States Patent [19]

Perkins et al.

[11] Patent Number: 4,960,486

[45] Date of Patent: Oct. 2, 1990

[54] METHOD OF MANUFACTURING RADIATION DETECTOR WINDOW STRUCTURE

[75] Inventors: Raymond T. Perkins; James M. Thorne; Larry V. Knight; Richard C. Woodbury, all of Provo, Utah

[73] Assignee: Brigham Young University, Provo, Utah

[21] Appl. No.: 483,796

[22] Filed: Feb. 23, 1990

Related U.S. Application Data

[62] Division of Ser. No. 202,468, Jun. 6, 1988, Pat. No. 4,933,557.

[51] Int. Cl.[5] .................... H01L 21/306; B44C 1/22; C03C 15/00; C03C 25/06

[52] U.S. Cl. .................... 156/633; 156/647; 156/659.1; 156/662

[58] Field of Search .............. 156/629, 630, 633, 645, 156/647, 654, 657, 659.1, 662; 250/505.1

[56] References Cited

U.S. PATENT DOCUMENTS

| | | | |
|---|---|---|---|
| 4,293,373 | 10/1981 | Greenwood | 156/647 X |
| 4,443,293 | 4/1984 | Mallon et al. | 156/647 |
| 4,576,679 | 3/1986 | White | 156/644 |
| 4,584,056 | 4/1986 | Perret et al. | 156/633 X |
| 4,675,525 | 6/1987 | Amingual et al. | 156/644 X |
| 4,885,055 | 12/1989 | Woodbury et al. | 156/647 |

*Primary Examiner*—William A. Powell

*Attorney, Agent, or Firm*—Thorpe, North & Western

[57] ABSTRACT

A radiation detector window structure for use with a radiation detection system includes a frame, a plurality of upstanding spaced-apart ribs held in place by the frame, where the tops of the ribs terminate generally in common plane, and a thin film of material disposed on the tops of the ribs to span over the gaps therebetween for passing the radiation to be detected and for filtering at least some of the unwanted radiation. The tops of the ribs are smoothed and rounded to minimize a chance of piercing the film placed thereover. The ribs are spaced to provide sufficient support for the film so that the thickness of the film may be reduced to better transmit desired radiation.

9 Claims, 1 Drawing Sheet

METHOD OF MANUFACTURING RADIATION DETECTOR WINDOW STRUCTURE

This is a division of application Ser. No. 07/202,468 filed June 6, 1988, U.S. Pat. No. 4,933,557.

BACKGROUND OF THE INVENTION

This invention relates to a window structure for transmission of radiation, such as X-rays, to radiation detector elements.

X-ray detectors are used in a variety of situations including electron microscopy, X-ray telescopy, and X-ray spectroscopy. Each situation may subject the detector to different environmental and operating conditions such as atmospheric pressure on the equipment, various energy levels of the radiation, etc. For example, some energy-dispersive detectors must be operated in a vacuum. If the detector is used in an electron microscope, then it will be subjected to and must be able to withstand scattered high-energy electrons. For proton induced X-ray emission detection, the detector must withstand scattered high-energy protons.

X-ray detectors typically include in the structure some type of window or receptor for receiving and passing radiation to detector elements. The window structure includes a piece of material for passing the desired radiation and filtering or blocking undesired radiation, where the material is placed over an opening or entranceway to the detector. Exemplary materials which have been used in the past include beryllium, alumized polypropylene, silicon nitride, silicon, boron nitride, boron, and polyethylene terphthalate (mylar), all formed into a film or sheet to cover and span the required opening. Because of the size of the openings to be covered in prior art structures, typically six mm wide, the films must be formed thick enough to withstand pressures to which the detector would be subjected, gravity, and normal wear and tear from use of the detector. However, the thicker is the film, the more absorptive it is so that some radiation which the user desires to detect might be absorbed by a film which is too thick. For example, the longer are the X-ray wave lengths, the more likely they are to be absorbed by a thick film. It is therefore desirable to provide a window film which is as thin as possible but yet sufficiently thick and sturdy to span the opening to be covered, and to withstand differential pressure—e.g., at least one atmosphere.

One approach to meeting the need of providing a thin film which is capable of spanning radiation entrance openings is to utilize a screen or mesh as a film support. In other words the screen or mesh is placed over the opening and then the film is placed on the screen or mesh to be supported thereby. This type of support structure, however, has a number of drawbacks, the primary one being that the screens and meshes are rough and coarse and thus, at the locations they contact the film, the film is caused to stretch, weaken and burst. Increasing the thickness of the film to compensate simply results in increasing the absorptive characteristics of the film so that certain radiation cannot be detected. Another disadvantage of the use of screens and meshes is that they themselves can break under pressure. Making screens and meshes stronger by thickening the wires (and making smaller openings) results in the undesired blockage of more radiation.

SUMMARY OF THE INVENTION

It is an object of the invention to provide a window structure in a radiation detector which is rugged and able to withstand a wide range of pressures to which it may subjected.

It is another object of the invention to provide such a window structure which is both rugged and capable of transmitting a wide range of radiation energies.

It is a further object of the invention to provide a window structure which is capable of supporting and maintaining intact thin films for transmitting radiation to the radiation detector.

It is also an object of the invention to provide a window structure having the additional capability of collimating radiation delivered to the radiation detector.

The above and other objects of the invention are realized in a specific illustrative embodiment of a window structure for a radiation detection system where the structure includes a frame and a plurality of upstanding, generally spaced-apart parallel ribs secured to the frame. The tops of the ribs advantageously terminate in a common plane for supporting a thin film of material which spans over the gaps between the ribs. The thin film of material is adapted to pass radiation of interest to a detector element or elements of the radiation detection system, and for filtering certain unwanted radiation.

The window structure may be constructed from a single piece of material or from separate pieces and then attached together as needed. Advantageously, the tops of the ribs are smoothed and rounded to contain no sharp edges which would puncture or weaken the thin film of material.

One illustrative method of constructing the window structure described above includes the steps of etching from a piece of material a series of cavities to thereby leave spaced-apart beams, dipping into a polymer solution a slide coated with a thin coat of sucrose, removing the slide from the polymer solution at a generally uniform rate to leave a thin polymer film on a surface of the slide, evaporating a thin film of aluminum onto the polymer surface, cutting the film into desired shapes, and then placing the slide in water to dissolve the sucrose film and release the polymer film from the slide to float on the water surface. The beams may then be placed under water and raised up under the desired floating polymer film so that the film contacts and adheres to the tops of the ribs. If desired, an adhesive could be used to further secure the film on the tops of the ribs.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
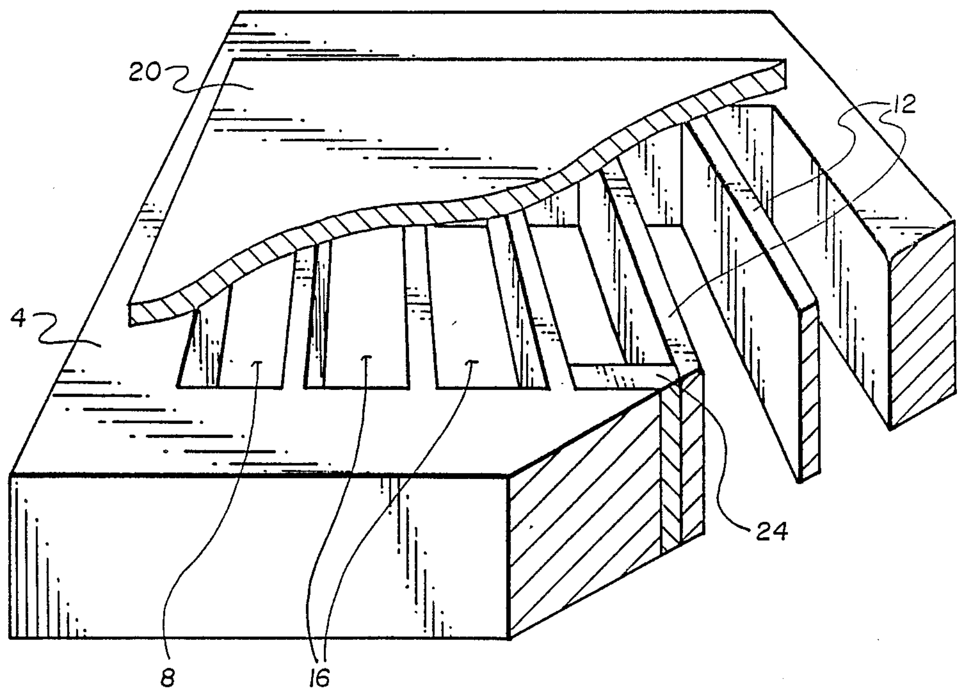
FIG. 1 shows a perspective, partially cut-away view of a window structure for a radiation detection system made in accordance with the principles of the present invention.

The window structure of FIG. 1 is for use with a radiation detector system such as an X-ray detector. Radiation detector elements would be positioned below the structure of FIG. 1 so that radiation would first pass through the structure before reaching detector elements (not shown) of the radiation detector system.

The window structure includes a frame 4 which circumscribes an opening 8 through which radiation passes as it travels to the detector elements. Formed to extend from one side of the frame to the opposite side in a generally parallel relationship are a plurality of upstanding ribs or beams 12. A plurality of cavities 16 are thus formed between the ribs 12. The tops of the ribs 12 generally define a common plane as shown in FIG. 1 to support a thin film of material 20.

The frame 4 and ribs 12 could be formed from a single piece of material by simply removing or etching the cavities 16 to leave the ribs 12 joined at their ends to opposite sides of the frame. For example, the frame and ribs could be fabricated from a silicon substrate with the cavities 16 being anisotropically etched using fairly conventional techniques such as that disclosed in copending patent application Ser. No. 07/087,778, filed Aug. 21, 1987, U.S. Pat. No. 4,885,055. Alternatively, the ribs or beams 12 could be made separately from the frame 4 and then secured in place with an adhesive within the frame 4. To further secure and maintain the ribs in place, spacers, such as spacer 24, could be placed between the ribs 12 at the ends and secured to both the ribs and the frame 4. Advantageously, with such an arrangement, the ribs and spacers could be made of metal shim stock, with the frame 4 being made of brass.

As will be discussed momentarily, the thin film 20 will be placed on the tops of the ribs 12 to span over the cavities 16 and it is important that the thin film avoid possibilities of punctures, uneven stretching or localized weakening. To reduce the chance of such damage occurring to the film, the tops of the ribs 12 are rounded and polished to eliminate sharp corners and rough surfaces which might otherwise cause the damage. Forming the frame 4 and ribs 12 from a single crystal of silicon by etching serves to provide the rounding and polishing action desired. If other materials and methods of construction were used, then the tops of the ribs could intentionally be rounded and polished by mechanical or chemical methods.

The thin film 20, as indicated above, is placed on the tops of the ribs 12 and the frame 4 to completely cover the cavities 16 for the purpose of controlling the kind and amount of radiation which passes through the window structure to the detector elements. The film 20 is selected to be highly transmissive of X-rays, for example, and of X-rays having energies greater than 100 electron volts, while blocking visible light energy and other unwanted radiation. In addition, the film 20 is selected to withstand fluid pressures of up to one atmosphere (caused by fluids into which the structure may be immersed) without breaking so that fluid may not penetrate the window.

Advantageously, the film 20 is formed of a polymer material such as poly-vinyl formal (FORMVAR), butvar, parylene, kevlar, polypropylene or lexan. Nonpolymer materials such as boron, carbon (including cubic, amorphous and forms containing hydrogen), silicon nitride, silicon carbide, boron nitride, aluminum and beryllium could also be used. Whatever film material is selected, typically a thin coat of aluminum is applied to the surface of the film to prevent transmission of unwanted electromagnetic radiation. Alternatively, the film 20 could be integrally formed with the frame 4 and ribs 12 of the same material as the frame and ribs, such as silicon or doped silicon. This could be done by doping that portion of a silicon substrate to be used as the film with, for example, boron. That portion of the substrate thus doped resists etching and so the boundary between the doped and undoped areas (known as a p-n junction) serves as an "etch-stop". After doping, the cavities between the ribs can be formed by etching down to the etch-stop, leaving an integral structure of a frame, ribs and membrane.

A preferred embodiment of the film 20 comprises two layers of the polymer FORMVAR having a total thickness of from 10 to 1000 nm, but preferably about 250 nm for each layer. Also included is one or more coats of aluminum, having a total thickness of about 20 nm, disposed over the polymer film. Each aluminum surface oxidizes spontaneously in air to a depth of approximately 3 nm. This oxide is transparent to light and so the oxide layers do not contribute to the light-blocking capability of the film. However, the oxide does reduce permeation of nearly all gases and so having the layers of aluminum oxide increases the resistance of the film to deleterious effects of the environment in which the window structure is used.

With the film construction described above, about 85 percent of X-rays in the range of 0.18 to 200 kev would be transmitted through the window to a radiation detector. If other transmissive characteristics were desired, then other film materials and thicknesses may be required.

Knowing the transmissive characteristics desired of the thin film 20 and the pressures to which the film would be subjected, a suitable span or spacing of the ribs 12 to accommodate the pressure for the selected thickness can be readily determined. For example, using FORMVAR as the thin film material, a thickness of 250 nm allows for transmission of over 90% of carbon $K_\alpha$X-rays received, and an appropriate rib thickness and spacing to support the film under one atmosphere pressure would be 25 micro and 380 micro for a silicon support structure that is 380 micro height and ribs less than 2.5 cm long. Of course, various film thicknesses, and rib widths and spacings may be advantageous for different materials and different transmission capabilities.

Figure 2:
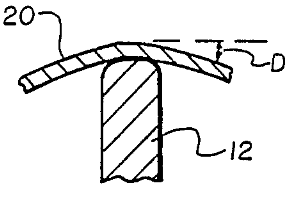
FIG. 2 is a cross-sectional view of a portion of the film and one rib of the structure of FIG. 1.

FIG. 2 is a fragmented, cross-sectional view of the film 20 positioned on top of one of the ribs 12. The film 20 is shown to sag as it leaves the top of the rib 12 by an angle D of about 3 degrees. Provision of some sag alleviates some of the tension in the film when it is subjected to pressure, and thus allows the use of a thinner, more transmissive film.

An exemplary method for fabricating the film 20 includes the following steps. First, a microscope slide having two oppositely facing planar surfaces, and the dimension of 7.5 by 5.0 cm, is placed in distilled water in an ultrasonic vibrator for 5 minutes or more. Next, the slide is dipped in an aqueous sucrose solution of from 10% to 40% wt/vol sucrose, which has been filtered to remove particles. Such dipping covers the slide with a thin film of sucrose, after which the slide is allowed to dry for about one hour or more. After drying, the slide with the sucrose film is dipped in a 0.1% to 6% wt/vol solution of FORMVAR in chloroform. This solution likewise is first filtered to remove particles, and the surface swept to remove floating debris. The slide is then slowly and uniformly pulled out of the solution, at an angle of about 90 degrees with respect to the surface of the solution, so as to form a thin, uniform film over the sucrose film on the slide. The thickness of the FORMVAR film is controlled by the speed at which the slide is pulled out of the solution and by the concentration of FORMVAR in the solution. Drawing the slide from the solution partially orients the long polymer molecules to be generally parallel to one another and parallel with the direction of removal of the slide.

After drawing the slide from the solution, the slide is allowed to dry for about 10 minutes, allowing the chloroform to evaporate, and this leaves the film of FORMVAR over the sucrose film on the slide.

Next, a thin layer of aluminum is evaporated, in a vacuum, onto one side of the slide after which one side of the slide will be covered with sucrose, FORMVAR, and aluminum and the other side will be covered only with sucrose and FORMVAR. It should be understood that the order of "aluminizing" and "drawing the film" may be reversed with equal results.

The films are then cut in squares or rectangles large enough to cover the frame 4 and ribs 12 of FIG. 1, by scratching the films with a fine pointed object such as a knife or razor blade. The cut rectangles are then separated from the slide and from one another by placing the slide (with films) in water, with the aluminized side facing upwardly. The water dissolves the sucrose film to release the FORMVAR aluminum film combination to float to the surface of the water.

To place the cut film on corresponding frame and rib structures, the structures are simply placed in the water and raised up under the film so that the film covers the frame and ribs as desired. Advantageously, the films will be placed upon the frame and rib structures so that the aligned polymer molecules will be oriented perpendicularly to the ribs. This orientation inhibits elongation of the polymer film when the film is subjected to pressure. It has been found that the films will adhere sufficiently to silicon frame and rib structures to make it unnecessary to use adhesives to attach the films.

Following placement of the films on the frame and rib structure, the resulting assembly is allowed to dry. Additional films may also be placed on the structure at this time, if desired. Such additional films serve to cover defects in the original film.

If it is contemplated for the window structure that pressure may be exerted against the film from one side at one time, and from the opposite side at another time, then a second support structure may be placed against the top of the film to, in effect, clamp the film between two frame and rib structures. The structure placed on the top would be a frame and rib structure similar to that shown in FIG. 2. The ribs of the top and bottom structures could either be oriented parallel to one another or perpendicular to one another to achieve the desired clamping effect.

In the manner described, a simple, efficient window structure is provided for transmitting to a radiation detector system certain radiation which is to be detected while filtering or blocking unwanted radiation. Because of the window structure, very thin films may be employed so that the amount of desired radiation transmitted is substantially maximized.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A method of making a radiation entrance window of a radiation detector comprising forming a plurality of spaced-apart beams, the tops of which generally define a plane, forming a thin film of material capable of passing radiation to be detected and of blocking unwanted radiation, and wherein the film is secured on the tops of the beams.

2. A method as in claim 1 wherein the beam forming step comprises etching from a piece of material a series of cavities to leave the spaced-apart beams held at their ends by integral end pieces.

3. A method as in claim 2 wherein the film forming step comprises (a) dipping into a polymer solution a slide having at least one generally planar surface, (b) removing the slide from the solution, with polymer film remaining on the planar surface, (c) cutting the film into desired shapes, (d) removing the film from the slide, and (e) securing the film onto the tops of the beams.

4. A method as in claim 3 wherein step (a) comprises first dipping the slide into and removing the slide from an aqueous sucrose solution to leave a thin film of sucrose on the planar surface of the slide, drying the slide, and then dipping the slide into the polymer solution.

5. A method as in claim 4 wherein the polymer solution comprises a 0.1 to 6 percent weight/volume of poly-vinyl formal in chloroform.

6. A method as in claim 3 wherein step (b) comprises removing the slide from the solution at a generally uniform rate and with the planar surface at an angle with surface of the solution.

7. A method as in claim 3 wherein the polymer film is formed with chains of polymer molecules oriented generally parallel to one another, and wherein step (e) comprises securing the film onto the beams so that the chains of molecules are generally perpendicular to the beams.

8. A method as in claim 4 wherein step (d) comprises placing the slide in water with the planar surface facing generally upwardly until the sucrose film dissolves and releases the polymer film to float on the water surface.

9. A method as in claim 7 wherein step (e) comprises placing the beams under water and raising the beams up under a floating polymer film to position and secure the film on the tops of the beams.

* * * * *